United States Patent [19]

Ichise et al.

[11] Patent Number: 5,586,193
[45] Date of Patent: Dec. 17, 1996

[54] SIGNAL COMPRESSING AND TRANSMITTING APPARATUS

[75] Inventors: Atsushi Ichise; Kenji Inoue, both of Kanagawa, Japan

[73] Assignee: Sony Corporation, Tokyo, Japan

[21] Appl. No.: 202,273

[22] Filed: Feb. 25, 1994

[30] Foreign Application Priority Data

Feb. 27, 1993 [JP] Japan .................................. 5-063375

[51] Int. Cl.⁶ .............................. H03G 7/00; G01L 3/02; G01L 9/00
[52] U.S. Cl. ......................... 381/106; 381/104; 395/2.17; 395/2.23; 395/2.1
[58] Field of Search .................................. 381/106, 104, 381/110, 29, 30, 31, 34, 35; 395/2.6, 2.16, 2.17, 2.23, 2.55, 2.40, 2.42, 2.1, 2.31; 333/14

[56] References Cited

U.S. PATENT DOCUMENTS

| | | | |
|---|---|---|---|
| 4,330,689 | 5/1982 | Kang et al. | 395/2.16 |
| 4,541,110 | 9/1985 | Hopf et al. | 395/2.42 |
| 5,038,402 | 8/1991 | Robbins | 381/2 |
| 5,054,073 | 10/1991 | Yazu | 381/36 |
| 5,130,662 | 7/1992 | Jorgensen et al. | 281/81 |

OTHER PUBLICATIONS

Corporate Computer Systems, Inc., "CDQ 2000 Musicam™ Multi-Rate Digital Codec", 1992, pp. 1–5.

Primary Examiner—William Cumming
Assistant Examiner—Xu Mei
Attorney, Agent, or Firm—Jay H. Maioli

[57] ABSTRACT

Audio signals are compressed by selecting either a first compression mode providing high-quality sound and a relatively long processing time or a second compression mode having a shorter processing time in accordance with the contents of the audio input signals, for example, whether the signals are audio signals such as music or voice signals such as an announcement. By providing selectable compression time periods music can be enjoyed in high-quality sound, while the announcement of a message can be delivered satisfactorily without the loss of any information.

10 Claims, 7 Drawing Sheets

SIGNAL COMPRESSING AND TRANSMITTING APPARATUS

BACKGROUND OF THE INVENTION

1. Field of the Invention

This invention relates generally to an apparatus for compressing and transmitting signals, and more particularly to a signal compressing apparatus and a signal transmitting apparatus for selectively compressing audio signals to provide high-quality sound or compressing voice signals so as to shorten a time delay due to compression processing.

2. Description of the Prior Art

A variety of techniques for high efficiency encoding of audio signals have been previously proposed. These techniques may be exemplified by sub-band coding (SBC) which is a non-blocking frequency band dividing technique for dividing, without blocking, audio signals in the time domain into plural frequency bands and encoding them. The so-called transform coding is a blocking frequency band dividing technique for converting signals in the time domain into signals in the frequency domain by spectral transform, so as to divide the signals into plural frequency bands and then encode each band.

Also, a technique for high-efficiency encoding comprised of a combination of the sub-band coding and the transform coding has been considered. In this technique, after the band division is carried out by the sub-band coding, the signal of each band is spectral-transformed into a signal in the frequency domain, and then each spectral-transformed band is encoded. A so-called QMF filter may be used as a filter for the band division.

The spectral transform is for blocking input audio signals by a predetermined unit time, that is, a frame, and converting the time domain signals into the frequency domain by carrying out the fast Fourier transform (FFT), the cosine transform (DCT), and the modified DCT transform (MDCT). The MDCT is described in J. P. Princen, A. B. Bradley, Univ. of Surrey, Royal Melbourne Inst. of Tech., "Subband/Transform Coding Using Filter Band Designs Based on Time Domain Aliasing Cancellation," ICASSP 1987.

By quantizing the signals which have been thus divided for each band by the filter and the spectral transform, it is possible to control the bands in which a quantization noise is generated and to carry out encoding of higher efficiency in terms of auditory sense by utilizing characteristics such as masking effects. If each band is normalized at the maximum of the absolute value of the signal component of the band prior to the quantization, it is possible to carry out encoding of still higher efficiency.

As for the frequency division width for quantizing each frequency component produced by the frequency band division, band division taking account the characteristics of the human auditory sense is carried out. More specifically, there are several cases in which the audio signal is divided into a number of bands, for example, 25 bands, with the bandwidth of a so-called critical band being wider toward the higher frequency band. Encoding data of each band in this case is carried out by predetermined bit allocation or by adaptive bit allocation. For example, in encoding by the bit allocation method the coefficient data produced by the MDCT processing, the MDCT coefficient data of each band are encoded with the adaptive number of the allocated bits.

Such high-efficiency compressing encoding is appropriate for transmitting audio signals of high quality without widening the transmission band. For example, when a system is to be constructed by which audio signals are listened to separately through headphones or earphones at a number of seats in a vehicle such as an aircraft, and wherein audio signals can be freely selected for each seat from among the audio signals of multiple channels, it is desirable to employ the high efficiency compression coding as described above in order to realize multiple-channel transmission without causing deterioration of the quality of the audio signals.

In the above-described high efficiency compression coding technique in which a high compression rate and high sound quality are maintained, it is often the case that a relatively long time is required for compression and expansion, thus generating a time difference between the compressed/expanded signals and those directly transmitted without being compressed/expanded. For this reason, in case the high-efficiency compression coding is applied to an audio system of headphone-listening type provided for each seat of a vehicle such as an aircraft, a time difference is caused between the audio signals through the headphones and the sounds in an announcement from the cockpit through PA speakers provided on the walls and ceilings. This causes difficulty in listening to and understanding the announcement.

When a message from the cockpit is announced in the aircraft, the channel selection status of audio signals at each passenger seat is mandatorily switched over to a predetermined PA channel, while the announcing voice in output through the PA speakers, so as to assure delivery of the message to the passengers listening over the headphones at the time of the announcement. Therefore, if a delay due to the compression/expansion time is generated in the announcement voice through the headphones, while the announcement voice through the PA speakers is directly reproduced as a normal analog transmission without having a temporal delay, the time difference between these voices causes an apparent echo, thus resulting in difficulty in hearing causing a loss of part of the words at the time when the PA channel is mandatorily selected.

In addition, if one were simply to compress/expand the announcement using the high-quality sound technique, when the compressed voices are transmitted to speakers in the cabin, the person announcing the message hears his or her own voice through the speakers. Therefore, the large temporal delay may cause confusion.

In view of the above-described status of the art, it is an object of the present invention to provide a signal compressing apparatus and a signal transmitting apparatus by which audio signals such as music are maintained at a high quality, while voice signals such as a message to be announced are compressed/expanded in a short time, so as to have a small temporal delay.

OBJECTS AND SUMMARY OF THE INVENTION

It is, therefore, an object of the present invention to provide a signal transmission apparatus in which the signals are compressed and expanded that can overcome the above-noted defects inherent in the prior art.

According to one aspect of the present invention there is provided a signal compressing apparatus including a signal compressing unit that is capable of switching between a first compression mode requiring a predetermined time for signal compression and a second compression mode having a shorter signal compression time than in the first compression mode, the first compression mode and the second compression mode being selected in accordance with the contents of the signals to be compressed.

According to another aspect of the present invention there is provided a signal transmitting apparatus for compressing signals of plural channels and then multiplexing and transmitting the signals, in which the signal compressing apparatus includes a signal compressing unit that is capable of switching between a first compression mode requiring a predetermined time for signal compression and a second compression mode having a shorter signal compression time than in the first compression mode. The first compression mode and the second compression mode are selected in accordance with the contents of the signals to be compressed.

It is preferable that the first compression mode is a mode for carrying out high-efficiency encoding for adaptively controlling bit allocation for each band divided in a direction in the frequency domain utilizing characteristics of the human auditory sense, while the second compression mode is an adaptive differential PCM mode. Also, it is preferable when audio signals, such as music, and voice signals, such as an announcement, are used as the contents of the signals to be compressed, the audio signals should be compressed in the first compression mode and the voice signals should be compressed in the second compression mode.

When high sound quality is required as in music listening, the high efficiency compression coding is carried out on the signals in the first mode which causes less deterioration in sound quality even with a relatively long processing time. When the temporal delay is to be reduced as in making an announcement, the processing in the second compression mode having the shorter processing time is carried out on the signals. Thus, signal transmission can be carried out in the optimum mode for whatever signals are to be transmitted.

DETAILED DESCRIPTION OF PREFERRED EMBODIMENTS

Figure 1:
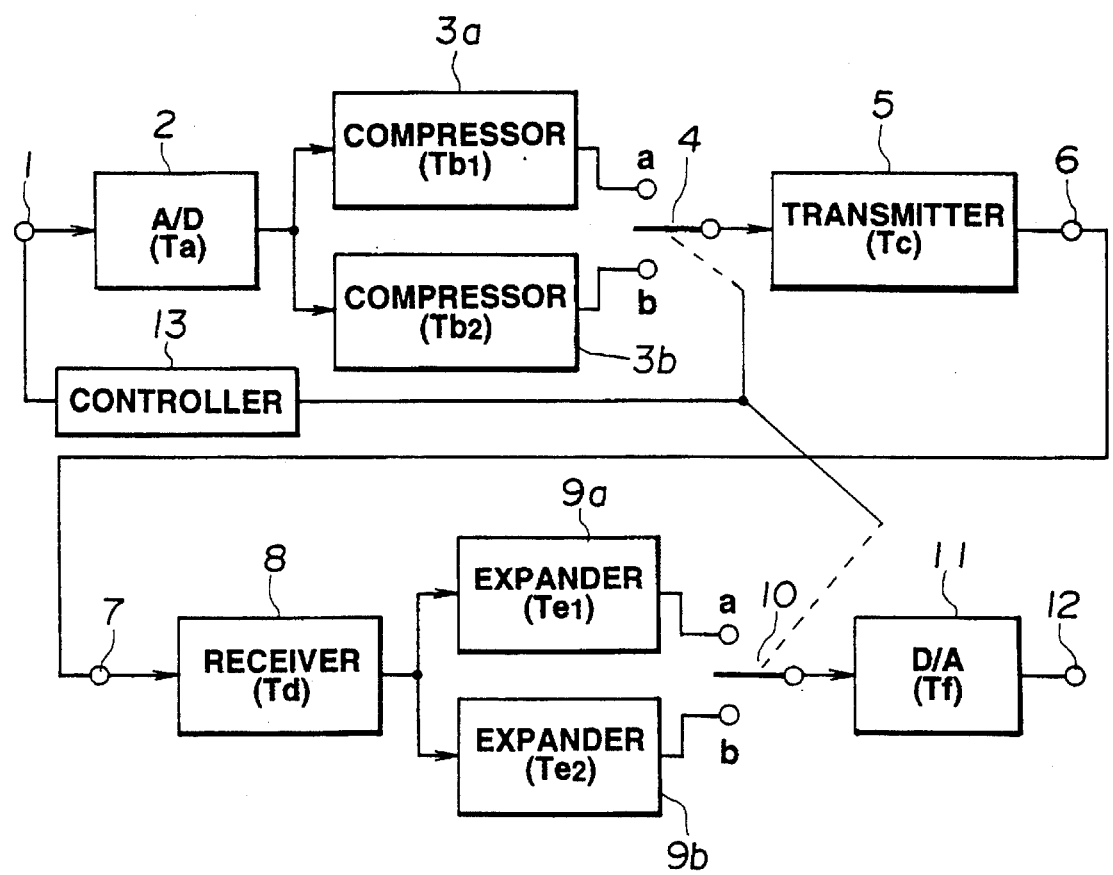
FIG. 1 is a schematic in block diagram form of a signal transmitting system including a signal compressing apparatus according to an embodiment of the present invention.

FIG. 1 shows a block diagram of a signal transmitting/receiving system to which a signal compressing apparatus and a signal transmitting apparatus of the present invention are applied, in which audio or voice signals supplied to an input terminal 1 are converted by an analog-to-digital (A/D) converter 2 into digital signals. The digital signals are then transmitted to a compressing circuit 3a for compression-encoding in a first compression mode that requires a predetermined time for signal compression, and to a compressing circuit 3b for compression-encoding in a second compression mode requiring a shorter signal compression time than in the first compression mode. Output signals from these compression circuits 3a and 3b are fed to terminals a and b of a change-over switch 4, respectively. Output signals from the change-over switch 4 are fed to a transmitting circuit 5 that includes a modulator and a multiplexer, not shown, so as to be converted into transmission signals that are then transmitted via an output terminal 6.

The signals transmitted from the output terminal 6 and supplied to an input terminal 7 are fed to a receiving circuit 8 including a demodulator and a demultiplexer, not shown. Output signals from the receiving circuit 8 are transmitted to an expanding circuit 9a for expansion-decoding in a first expansion mode corresponding to the first compression mode, and to an expanding circuit 9b for expansion-decoding in a second expansion mode corresponding to the second compression mode. Output signals from these expanding circuits 9a, 9b are fed to terminals a, b of a change-over switch 10, respectively. Output signals from the change-over switch are converted by a digital-to-analog (D/A) converter 11 into analog signals, and are then outputted via an output terminal 12.

The compressing circuits 3a, 3b and the expanding circuits 9a, 9b may be constituted by separate circuit elements, however, it is preferable to realize these circuits in the form of software using a so-called digital signal processor or the like. In such case, the switching between the compressing circuits 3a and 3b, and the switching between the expanding circuits 9a and 9b, are to be realized by switching the processing algorithms.

In the circuit of FIG. 1, the time required for conversion by the A/D converter 2 is denoted by Ta, and the times for compression by the compressing circuits 3a, 3b are denoted by Tb1, Tb2, respectively. Similarly, the required time for the transmitting circuit 5 is denoted by Tc, and the required time for the receiving circuit 8 is denoted by Td. The required times for the expanding circuits 9a, 9b are denoted by Te1, Te2, respectively, and the required time for the D/A converter 11 is denoted by Tf.

Figure 2:
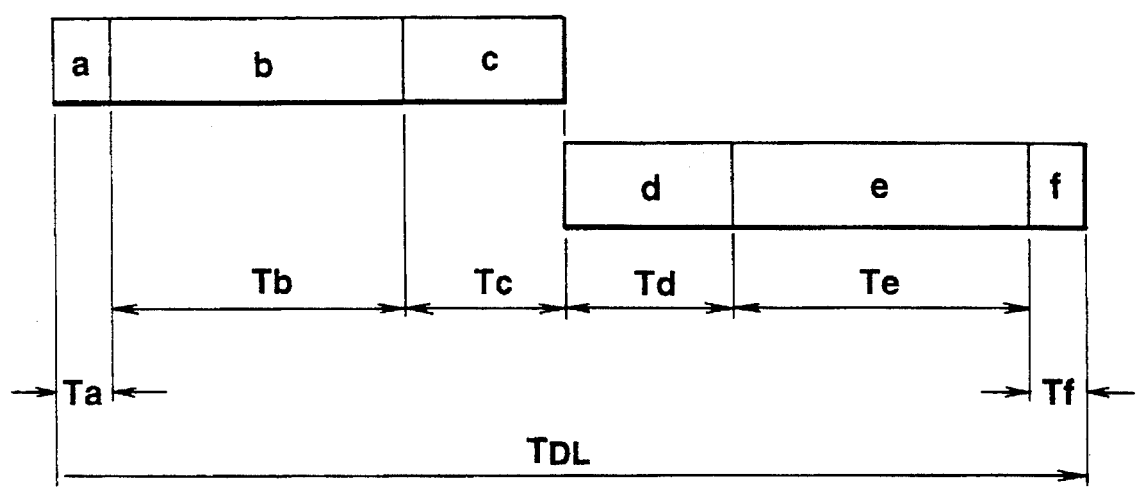
FIG. 2 is a representation illustrating a time required for processing in the signal transmitting system of FIG. 1 and a delay time.

Assuming these values of the above, a temporal delay TDL is generated, as shown in FIG. 2, until the signal entering at the input terminal 1 is output from the output terminal 12. In FIG. 2, block a through f denote the respective processing times by the A/D converter 2 through the D/A converter 11.

The first compression mode may be exemplified by a so-called ATRAC (Adaptive Transform Acoustic Coding) mode, which is employed for signal compression in the so-called MD or mini disc, while the second compression mode may be exemplified by an Adaptive Differential (AD) PCM mode, which is employed for signal compression in the so-called (CD-I) or the like.

In the algorithm of the ATRAC mode, a sound frame consisting of 512 samples is compressed, and 512 samples of data are generated at the expander side. In consideration of the time required for transmission, a delay of at least 4 frames is generated in the time domain. Further, if multiplexer and demultiplexer ICs are used for transmitting and receiving signals, a processing time of approximately 1 msec is required in each of the ICs, and a delay is also generated in the digital filters within the A/D and D/A converters. With a sampling frequency fs being 32 kHz, the required times Ta, Tf for the A/D and D/A converters are about 32 μsec, respectively, while the required times Tb, Te (Tb1, Te1 in the first compression mode) for the compression and expansion are about 32 msec, respectively. Therefore, the delay time TDL is approximately 75 msec.

It will be appreciated that, although voices of a movie shown in an aircraft are delayed from the image thereof by approximately 75 msec, this delay is of no problem because a so-called lip-sync of up to about 120 msec is generally allowed.

Nevertheless, in the case of a so-called Passenger Address (PA) override for announcing a message from the cockpit in an aircraft, the person announcing the message hears his or her own voice through speakers in the aircraft while speaking into a microphone. Therefore, the temporal delay as described above is not allowed and it is necessary to shorten to the least possible level a temporal delay from when the switch of the microphone is turned on until when the voice is output through the speakers in the cabin. For this reason, in the PA override operation the second compression mode is selected so as to shorten the temporal delay.

When the ADPCM mode is used for the second compression mode, the times $Tb_1$, $Te_1$, or Tb2, Te2 in the second compression mode, required for the compression and expansion are each about 6 msec, thus shortening the delay time TDL to about 15 msec. In the ADPCM of this example, it is necessary to add range bits and filter bits other than audio data, so that a check sum is added for detecting transmission errors, so as to transmit data by a block of for example 16 samples×2 channels as a unit.

The changeover switches 4 and 10 are switched between terminals a and b in response to the nature of the input signal, that is, either music or voice announcement. A controller 13 is provided to receive the signal input at terminal 1 and to discriminate the nature of that input signal and actuate the switches 4 and 10 accordingly. For example, when a music signal is input at terminal 1 the controller 13 moves switches 4 and 10 to their respective terminals a, whereas when the voice announcement signal is present at terminal 1 the switches 4 and 10 are changed over to their respective terminals b. Discrimination between kinds of signals can be performed many different ways. For example, signal bandwidth can be discriminated, since the music signal will have a much greater bandwidth than the passenger announcement signal. Furthermore, as noted, the compression can be performed by a digital signal processor with the two different compressions/expansions being changed over by choosing different software algorithms, in which case the controller 13 is not required since the information necessary to change algorithms will be inherent in the input signal.

Accordingly, entertainment such as music can be enjoyed with a high sound quality in the first compression mode, while the voice echo is absent in the PA mode, thus contributing to a safe flight.

Figure 3:
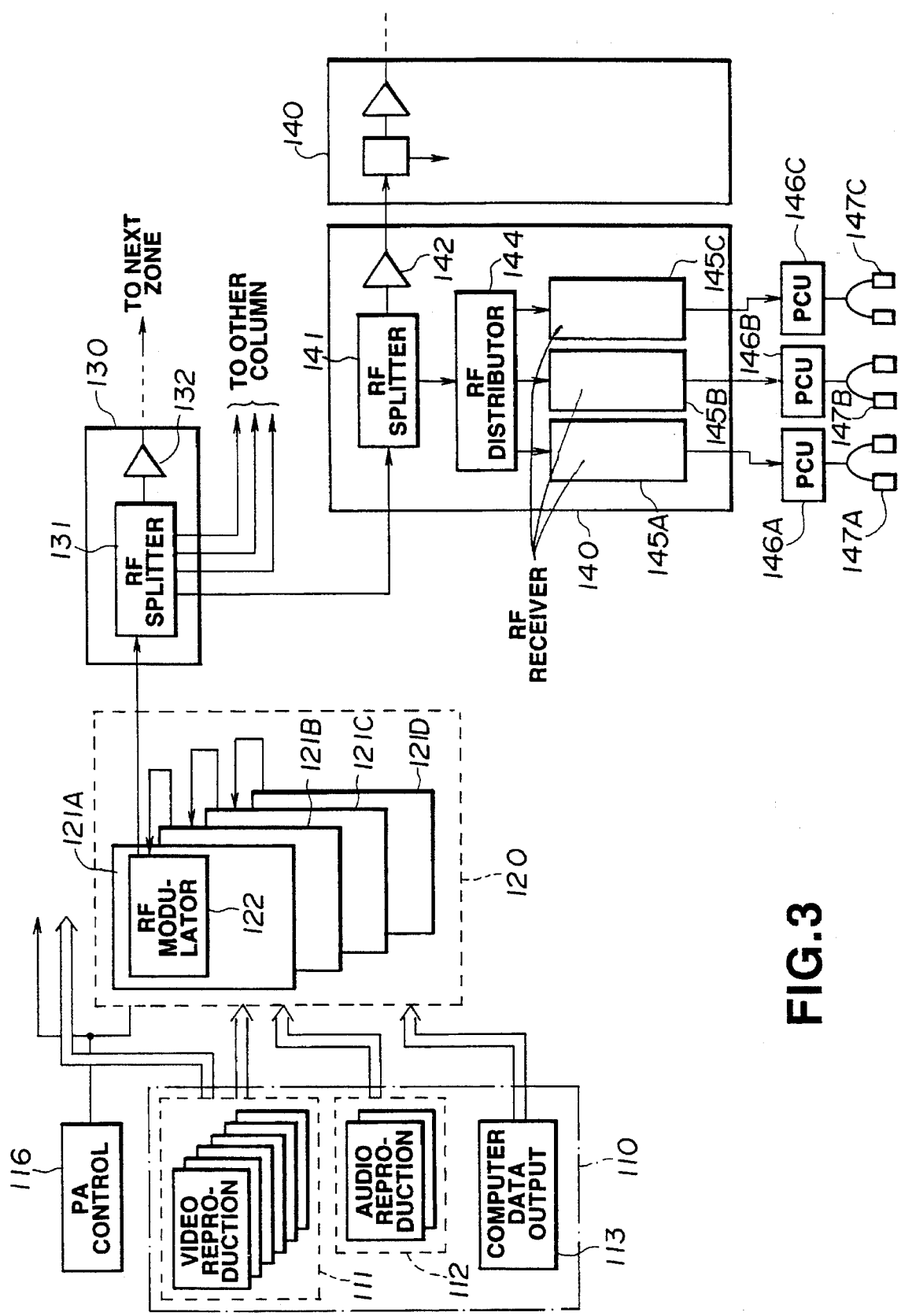
FIG. 3 is a block diagram of an audio signal transmitting system to which an embodiment of the signal compressing apparatus of the present invention is applied.

A signal transmitting system will now be described with reference to FIG. 3, to which the signal compressing apparatus of the present invention as described above is applied. FIG. 3 is a schematic block diagram showing an arrangement of a system by which passengers in their respective seats of the aircraft listen to audio signals through headphones.

In FIG. 3, a general signal source 110 includes video signal reproducing equipment 111, such as a video tape recorder (VTR) or a video disc player, audio signal reproducing equipment 112, such as a compact disc (CD) player and a tape recorder, and a computer data output device 113, such as a video game software. Also provided is a so-called Passenger Address (PA) controlling device 116 having a cabin announcement function using a microphone.

Among output signals from these units of equipment, audio or voice signals supplied from the video signal reproducing equipment 111 and the audio signal reproducing equipment 112, and computer data supplied from the computer data output device 113, are transmitted to an audio signal transmitting device 120. Video signals supplied from the video signal reproducing equipment 111 are similarly transmitted to a video signal transmitting device, not shown. Voice signals supplied from the PA controlling device 116 are directly transmitted as analog voice signals to speakers, not shown, provided on cabin walls and ceilings, and at the same time, these voice signals are transmitted to the audio signal transmitting device 120.

The audio signal transmitting device 120 has therein up to four audio signal transmitting units 121A, 121B, 121C, 121D, one of which multiplexes 32-channel audio signals and 8-channel data signals, or 36-channel audio signals, and modulates the signals into RF signals using an RF modulator 122 so as to output the RF signals. The RF modulator 122 is provided with an RF mixing circuit therein that mixes RF signals from the other audio signal transmitting units. Specifically, the RF modulator 122 frequency-multiplexes RF signals having carrier frequencies that vary for each audio signal transmitting unit 121A through 121D, and outputs the frequency-multiplexed RF signals. In this case, the video signals of plural channels supplied from the video signal reproducing equipment 111 may be modulated at the respective different carrier frequencies by an RF modulator, not shown, and be frequency-multiplexed along with the RF modulated signals of the audio signals, so as to be transmitted on one coaxial cable.

The frequency-multiplexed RF signals are fed to an RF splitter 131 of a zone administrating unit 130 that is provided for each zone into which the cabin is divided. The RF signals are then fed on to the next zone via the RF splitter 131 and an RF amplifier 132. Each cabin zone is divided into columns and the RF signals from the RF splitter 131 are split off for each column. Plural seat units 140 are connected in series within each column, and the RF signals fed to one of the seat units 140 are fed on to the next seat units 140 via an RF splitter 141 and an RF amplifier 142.

Each seat unit 140 is provided with circuits to supply signals to three passenger seats. The RF signal split by the RF splitter 141 is distributed into three identical RF signals by an RF distributor 144, and are fed to three RF receivers 145A, 145B, 145C, respectively. In the RF receiver 145, RF signals of one band of the frequency-multiplexed signals are taken out and RF-demodulated, and signals of the desired channel from the demodulated signals are taken out for reproduction. The signals output from the RF receivers 145A through 145C are fed to passenger controlling units (PCU) 146A through 146C, respectively. The passenger at each seat can connect the controlling units 146A through 146C with headphones 147A through 147C, respectively, so as to personally select audio signals of a desired channel for listening.

Figure 4:
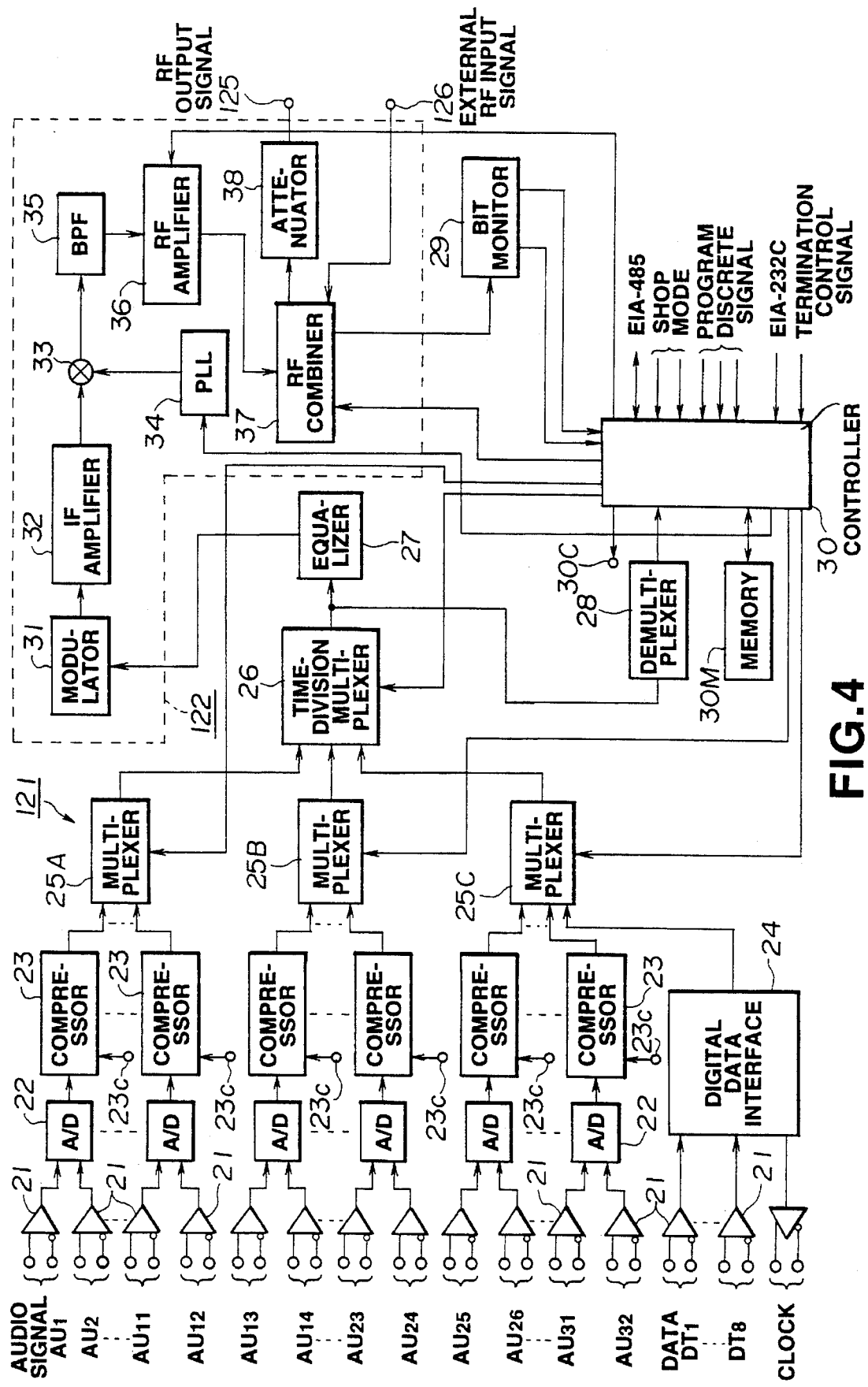
FIG. 4 is a block diagram showing the audio signal transmitting unit of FIG. 3 in more detail.

One of the audio signal transmitting units 121A–121D at the audio signal transmitter side is shown in more detail at 121 in FIG. 4, in which audio signals of 32 channels and data signals of 8 channels are input thereto, and the input signals are converted into signals having a frequency band of 6 MHz for output. The audio signal transmitting unit 121 is called an audio multiplexer unit or AMUX, on the basis of its function to multiplex audio signals and output them.

Audio signals AU1 through AU32 representing 32 channels are supplied to the transmitting unit 121 in the form of balanced inputs, and these signals are converted into unbalanced signals by a respective plurality of buffer amplifiers 21. The audio signals of 32 channels supplied from the buffer amplifiers 21 are grouped into two channels each for stereo left and right channels and are fed to a respective plurality of A/D converters 22 so as to be converted into digital signals. The digital signals are then fed to a respective plurality of signal compressing circuits 23 so as to be compression-encoded. The signal compressing circuits 23 perform out high efficiency compression encoding such as to adaptively control, in accordance with input signals, bit allocation for each band along the frequency axis utilizing the characteristics of the human auditory sense, or so-called AD-PCM encoding.

Computer data on lines DT1 through DT8 for the 8 channels of video game software or the like are input in a balanced form in accordance with the EIA-422 interface format and are converted into unbalanced signals by the buffer amplifiers 21 and fed to a digital data interface circuit 24.

For the signal compressing circuit 23 it is preferable to use a circuit that is capable of switching between a first compression mode for carrying out high efficiency encoding for good sound quality, though taking a long processing time, utilizing the characteristics of the human auditory sense and a second compression mode of a relatively shorter processing time such as ADPCM. An example of such two mode compressors is shown by compressors 3a and 3b of FIG. 1. Thus, selective switching is provided to switch the mode to the first compression mode, in case audio signals such as music are transmitted to each seat, and so as to switch the mode to the second compression mode in case the channels are mandatorily switched to the PA channel for announcing a message from the cockpit. The first compression mode is preferable for enjoying music requiring high-quality sound, while the second compression mode is preferable for the announcement because there is little time difference between sounds through speakers provided on the cabin walls and ceilings and sounds through the headphones. The switching/selecting between the two compression modes is carried out by controlling signals from a controller 30. The controller 30 outputs such a compression mode control signal at output terminal 30C that is connected to an input 23c located at each of the compressors 23. The first compression mode is exemplified by the ATRAC mode employed for signal compression in the mini disc (MD), and by a so-called Precision Adaptive Sub-band Coding (PASC) mode employed for signal compression in the so-called digital compact cassette (DCC).

The output signals for the 32 channels supplied from the signal compression circuit 23 are grouped into 12 channels each in the form of 6 pairs of channels in order from the channel corresponding to AU1 of the original input audio signals, and are fed to multiplexers 25A and 25B, respectively. The outputs for the remaining 8 channels arranged in four pairs corresponding to inputs AU25 through AU32 and output signals from the digital data interface circuit 24 corresponding to data the eight channels DT1 through DT8 are grouped together and fed to a third multiplexer 25C. The digital data interface circuit 24 also produces clock signals that are fed out via a buffer amplifier.

Each of the multiplexers 25A through 25C processes signals according to the voice signal format of TV broadcasting signals, of satellite broadcasting signals, or of satellite communications. One transmission frame of the format according to the voice signal format is constituted by 32 bits by 64 rows. This one transmission frame includes at least 12 channels of data, each having 128 bits, for example, 12 audio channels, or 8 audio channels plus 8 computer data channels, a BCH error correction code, for example, a (63, 50) BCH code, and a preamble such as frame synchronization or a control code. Data are output from each multiplexer, for example, at a rate of 2.048 Mbps, and the data from the multiplexers 25A through 25C are fed to a time-division multiplexer 26. Thus, the data are output from the multiplexer 26 at a rate of 6.144 Mbps. The digital signals output from the time-division multiplexer 26 are waveform-equalized by an equalizer 27 and are compressed into a 6 kHz band, so as to be fed to the RF modulator 122.

In the RF modulator 122, the output signals supplied from the equalizer 27 are modulated by an intermediate frequency (IF) modulator 31 so as to be predetermined intermediate frequency (IF) signals. The resulting IF signals are amplified by an IF amplifier 32 and are fed to one input of a signal multiplier 33 that functions as a modulator. The other input of the multiplier 33 is connected to carrier frequency signals of a predetermined RF frequency from a Phase Locked Loop (PLL) circuit 34. The frequency of the signals from the PLL circuit 34 is controlled by a controller 30 using a CPU and the like, not shown. Output signals from the multiplier 33 are fed to a band-pass filter 35 (BPF) and then via an RF amplifier 36 to an RF signal combiner 37. RF signals from another audio signal transmitting unit are also supplied via an external RF input terminal 126 to the RF combiner 37. By causing the RF carrier frequency of the RF modulator 122 to differ from the carrier frequency of the external RF input signals from terminal 126, it is possible to carry out a frequency multiplexing operation by the RF combiner 37. The RF output signals from the RF combiner 37 are taken out from an output terminal 125 via an attenuator 38.

The RF frequency at the RF modulator 122 is such that, on the basis of three program discrete signals supplied to the controller 30, the frequency of the signal output from the PLL circuit 34 is variably controlled by controlling a dividing ratio or a pre-scaler value in the PLL circuit 34 by the controller 30, thus variably controlling the carrier frequency of the RF modulated signals from the signal multiplier 33. The carrier frequency of the RF signals is determined by the program discrete signals, so as to be different from the carrier frequency of the RF signals supplied from any of the other audio signal transmitting units. When the RF signal input from the external RF input terminal 126 is absent, the controller 30 grounds the external RF input terminal 126 by a termination control signal supplied to the controller 30, thus terminating the RF output at terminal 125.

The program discrete signals can be also used to inform the controller 30 that a passenger announcement is to take place so that the control signal is output at the terminal 30C and input at terminal 23C to set the compressor 23 in the second compression mode.

A self-diagnostic function of the audio signal transmitting unit 121 is provided in which output signals from the time-division multiplexer 26 are demultiplexed by the demultiplexer 28, and then are fed to the controller 30 for judging whether the multiplex is carried out normally or not. The RF signals from the RF combiner 37 are demodulated by the bit monitor 29, so that the controller 30 Judges whether the RF signals are normal or not. The self-diagnosis of the demultiplexer 28 and the bit monitor 29 may be carried out on the basis of presence/absence of errors and the quantity of errors produced by calculating the BCH error correction code added by the multiplexers 25A through 25C.

The diagnosis of the A/D converter 21 may be made by confirming the operation thereof by monitoring the output signals from the A/D converter 21 using the controller 30. As for the signal compressing circuit 23, the diagnosis may be made, by switching the mode thereof to a mandatory self-diagnosis mode or to a test mode, then causing the compression circuit 23 to output a 1 kHz sine wave, returning the sine wave to an audio signal by the bit monitoring 29, and then monitoring the signal by the controller 30.

These self-diagnoses are made by mandatorily switching the mode to the test mode at the times of turning the power on and of maintenance, if necessary. The self-diagnosis utilizing the error correction code added in the multiplexing is made periodically at predetermined cycles even in the normal operation. In case any failure is generated, the time and status of failure generation are written in, for example, a non-volatile memory 30M, thus storing the history. Not all of the signal paths necessary to perform the self-diagnosis described above are shown in FIG. 4.

The output level of the RF output signals supplied from the RF modulator 122 at terminal 125 can be used by the controller 30 to control the gain of the RF amplifier 36. The controller 30 is provided with so-called EIA-485 interface, through which it can monitor the current status and history of the failure and can control the output level of the RF signals.

Figure 5:
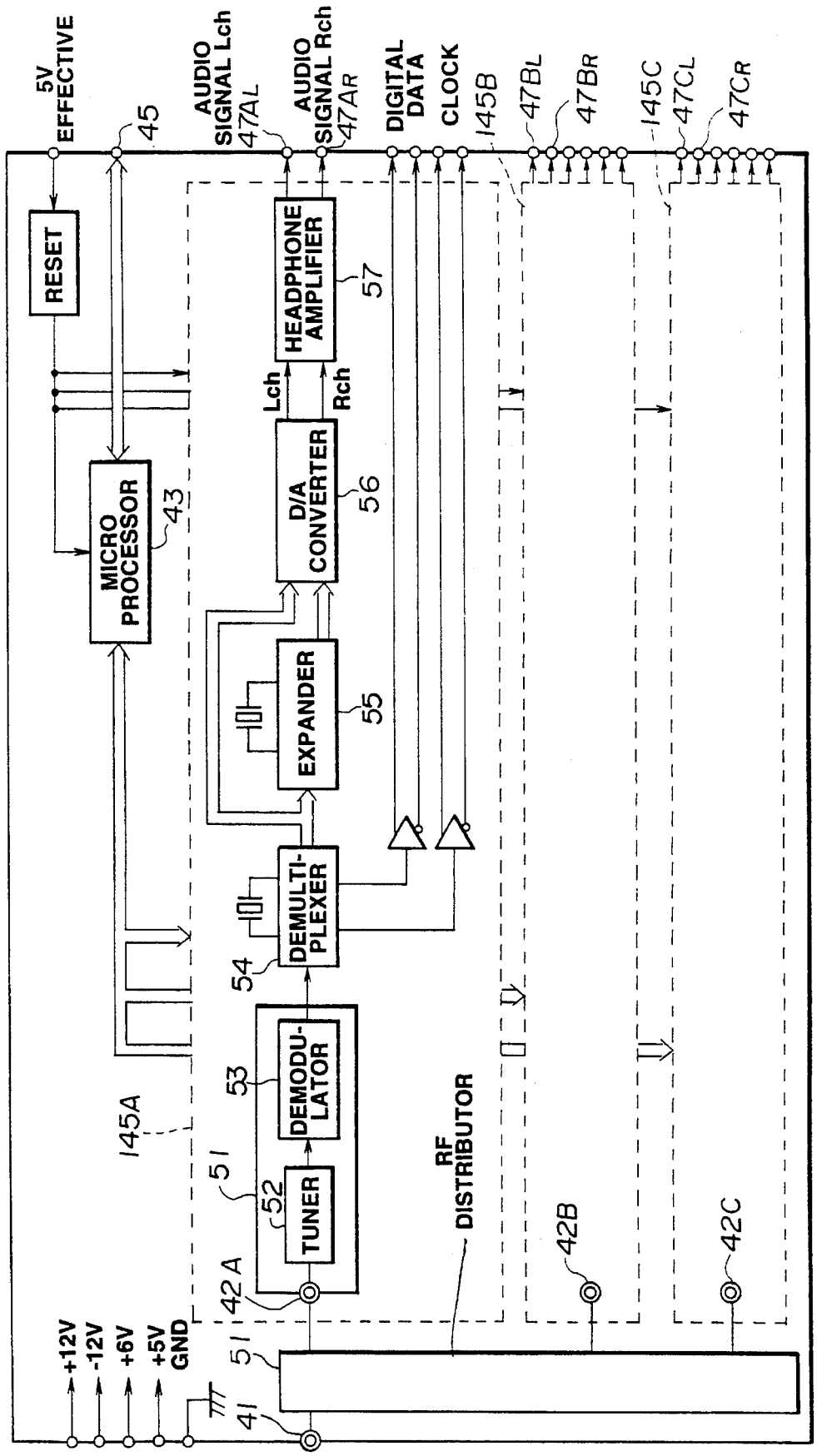
FIG. 5 is a block diagram showing a seat unit side for receiving audio signals according to an embodiment of the present invention.

An arrangement of the passenger seat unit 140 of FIG. 3, for receiving audio signals and particularly an arrangement of the RF distributor 144 and the subsequent parts of the second embodiment, is shown in detail with reference to FIG. 5.

In FIG. 5, the RF signal that has been split off by the RF splitter 141 of FIG. 3 is fed to an input terminal 41, and is then distributed into three RF signals by the RF distributor 144, so as to be fed to input terminals 42A through 42C of RF receivers 145A through 145C, respectively. Since these RF receivers 145A through 145C have the same internal arrangement, only one of the RF receivers, for example 145A, is shown, while the illustration of internal arrangements of the other receivers 145B and 145C is omitted. The suffix letter A is omitted from the reference numbers of the respective parts of the receiver 145A.

The RF signal is fed in at input terminal 42A of the RF receiver 145A and is transmitted to a tuner 52 of an RF receiving/demodulating circuit 51. The tuner 52 selects the RF signal of one band from among the RF signals that have been frequency-multiplexed at a frequency varying for each of the audio signal transmitting units 121A through 121D, and converts the selected RF signal into IF signals fed to a demodulating circuit 53. The demodulating circuit 53 demodulates the IF signal and outputs serial data at a data rate of 6.144 MHz for feeding to a demultiplexer 54.

The serial data supplied to the demultiplexer 54 are the time-division multiplexed three frames of the voice format or the format corresponding thereto of television signals of satellite broadcast or satellite communications, as described above. The demultiplexer 54 releases the time-division multiplex and takes out data corresponding to one frame. The demultiplexer 54 processes the data by error correction decoding, for example, by decoding the BCH error detection code, for each frame and then selects a desired audio channel or data channel. The error correction is for detecting and correcting the bit reversal error that may be generated by the effects of noise in transmitting or receiving the RF signals. The selection of a desired audio channel or data channel is made in accordance with a command from a micro processor 43.

If the time-division multiplex is released so as to take out a signal for one frame alone, an audio channel or data channel is to be selected from among the twelve audio channels, or from among the eight audio channels plus eight data channels, within one frame. The demultiplexer 54 of the present embodiment is arranged to select any arbitrary two audio channels or any arbitrary one data channel from among the 32 audio channels and 8 data channels corresponding to the three frames. Signals corresponding to any arbitrary two frames may be taken out in releasing the time-division multiplex.

The digital data and clock selected by the demultiplexer 54 are taken out via respective buffer amplifiers. The audio signals of the two channels, stereo right and left, selected by the demultiplexer 54 are transmitted either directly or via an expanding circuit 55 to a D/A converter 56.

In the expansion operation performed by the expanding circuit 55, a first expansion mode corresponding to the first compression mode and a second expansion mode corresponding to the second compression mode can be selected. This mode switching and volume setting are carried out by a command placed on the control bus by the micro processor 43. Because the microprocessor bus is connected to the distributed RF signal, the microprocessor 43 knows what kind of signal is being input and thus controls the expander 55, which corresponds to expanders 9a and 9b of FIG. 1, to operate in either the first or second mode. The connections between the RF input signal, the microprocessor 43, and the expander 55 are not shown to simplify the drawing.

The D/A converter 56 receives 16-bit audio data expanded by the expanding circuit 55, and outputs analog audio signals of two channels to a headphone amplifier 57. The headphone amplifier 57 drives the headphone 147A connected via the passenger controlling unit 146A. The output signals of the headphone amplifier 57 are taken out via left and right output terminals $47A_L$ and $47A_R$.

In the self-diagnosis operation of such circuit the micro processor 43 makes a functional diagnosis of each part thereof, such as a CPU, a RAM, a ROM and a so-called watchdog timer, not shown. If there is trouble or a failure in any of tuning by the tuner 52, demodulation by the demodulator 53, or error correction by the demultiplexer 54, the results of such error detection read by the micro processor 43 and are stored in a memory, not shown. This processing can be checked by calculating the BCH error correction codes that were added to the transmission signals by the demultiplexer 54 and by reading out the error flags. A control to a muted status or a control for not releasing a currently muted status may be carried out while the error flag results are stored in the memory.

In an audio self-diagnosis operation, the expanding circuit 55 outputs test data in the form of a 1 kHz sine wave via the D/A converter 56 to the headphone amplifier 57, the output of which is in turn transmitted to the micro processor 43. The micro processor 43 detects the 1 kHz sine wave using an A/D converter provided therein, not shown, and thus confirms the normal operation of each circuit. Further, a 0-level signal, not shown, is output from the expanding circuit 55, and the output from a so-called 0-level input terminal of the D/A converter 56 is monitored by the micro processor 43. Thus, whether the D/A converter 56 operates normally or not can be confirmed.

The above-described self-diagnosis is made by mandatorily switching the mode to the test mode at the time of turning the power on or during a maintenance operation. The diagnosis by error detection in the demultiplexer 54 may be made, periodically at predetermined cycles or, if necessary, in the normal operation. The results of the diagnosis may be taken out via an input/output terminal 45. The micro processor 43 can have data entered or output via the input/output terminal 45.

Figure 6:
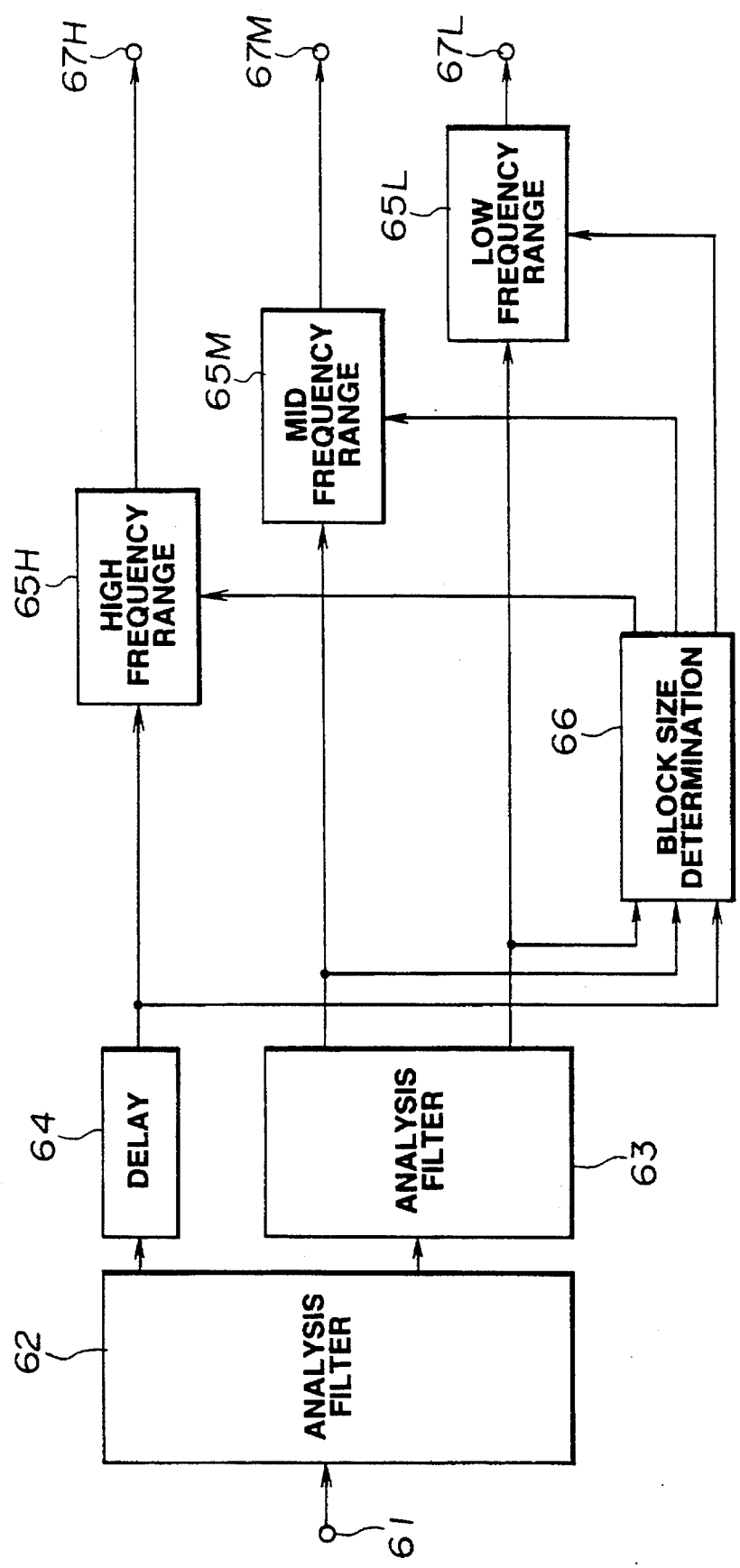
FIG. 6 is a block circuit diagram of an arrangement of a high-efficiency compression encoder that can be employed as the first compression mode according to an embodiment of the present invention.

The so-called ATRAC mode will now be described which can be used as the first compression mode, and FIG. 6 shows essential portions of an arrangement of the compression encoder side, in which audio signals fed in at an input terminal 61 are divided into high-frequency band components and mid-low-frequency band components by an analysis filter 62, the mid-low-frequency band components being further divided into mid-frequency band components and low-frequency band components by a second analysis filter 63. The high-frequency band components from the first analysis filter 62 are transmitted to an a modified discrete cosine transform (MDCT) circuit 65H via a delay circuit 64. The mid-frequency band components and the low-frequency band components from the second analysis filter 63 are transmitted to mid and low MDCT circuits 65M and 65L, respectively. The signals of the respective components from the analysis filters 63, 64 are transmitted to a block size determining circuit 66, from which block size determination signals in the modified discrete cosine transform are outputted and transmitted to the respective MDCT circuits 65H, 65M, 65L. The data signals in the frequency domain output from the respective MDCT circuit 65H, 65M, 65L are fed out via output terminals 67H, 67M, 67L, respectively. Data compression is carried out by subtracting data from the output signals in the frequency domain on the basis of the characteristics of the human auditory sense, particularly minimum audibility characteristics and auditory masking effects.

Figure 7:
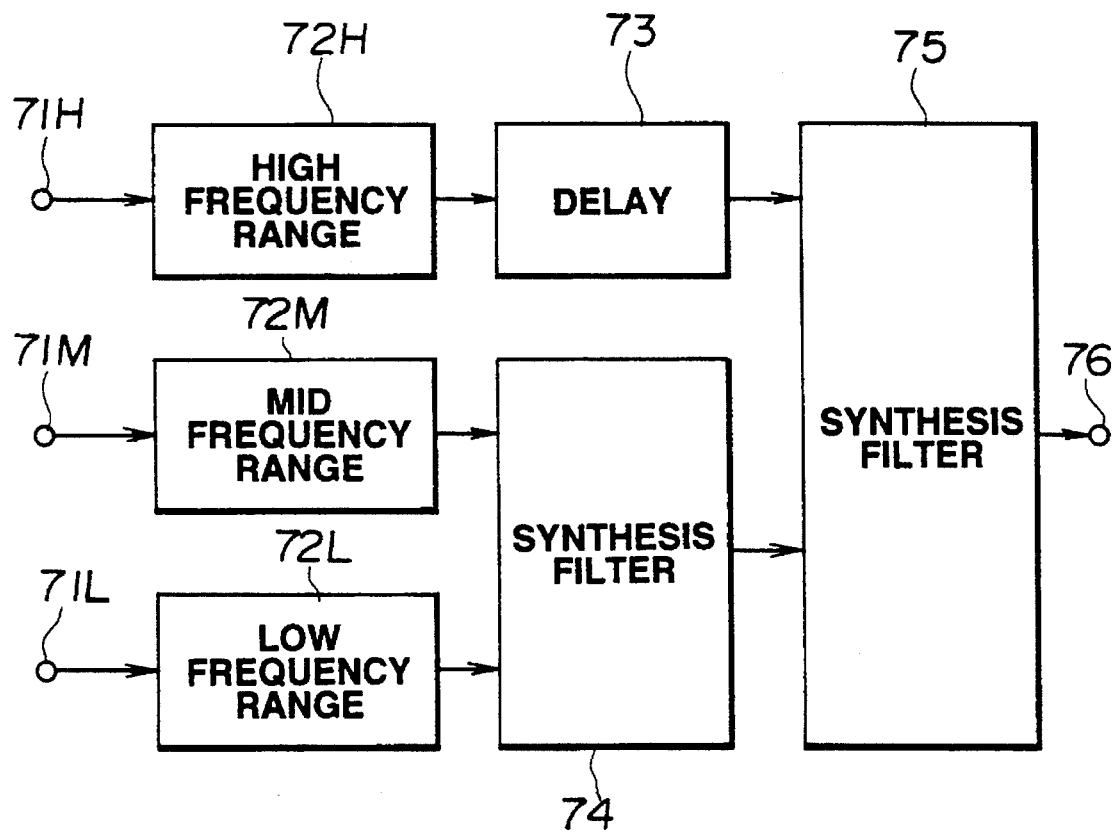
FIG. 7 is a block circuit diagram of an arrangement of an expander side corresponding to the first compression mode according to an embodiment of the present invention.

FIG. 7 shows essential portions of an arrangement of the expansion decoder side of the ATRAC, in which data signals in the frequency domain corresponding to the output signals from the respective output terminals 67H, 67M, 67L of FIG. 6 are supplied to input terminals 71H, 71M, 71L. The data signals are then fed to inverse modified discrete cosine transform (MDCT) circuits 72H, 72M, 72L for carrying out inverse processing of the MDCT. The output signals from the IMDCT circuit 72H are transmitted to a delay circuit 73, while the output signals from the IMDCT circuits 72M, 72L are transmitted to a synthesis filter 74. The output signals from the delay circuit 73 and the output signals from the synthesis filter 74 are transmitted to a synthesis filter 75 so as to be synthesized and outputted from an output terminal 76 as audio data signals in the time domain.

The present invention is not limited to the above-described embodiment and may be applied to a variety of high efficiency compression encoding modes for maintaining high sound quality, even with a long processing time. Such other modes might be the Precision Adaptive Sub-band Coding mode employed in so-called Digital Compact Cassette, other than the above-described ATRAC mode. Also, the present invention is not limited to the aircraft audio listening system, but may be applied audio listening systems of other vehicles.

As is clear from the above description, in the signal compressing apparatus according to the present invention, the first compression mode requiring a predetermined time for signal compression and the second compression mode of a shorter signal compression time than in the first compression mode are selected in accordance with the contents of the signals, for example, whether the signals are audio signals such as music or voice signals or are signals representing an announcement. Therefore, when high-quality sound is required as in listening to music, high-efficiency compression encoding is carried out in the first compression mode that provides less deterioration in sound quality even though it has a relatively long processing time. On the other hand, when the temporal delay is intended to be reduced as when making an announcement, processing is carried out in the second compression mode having a shorter processing time. Thus, the optimum compression mode can be selected in accordance with the contents of signals to be provided to the listener.

In addition, in the signal transmitting apparatus according to the present invention for compressing the signals of plural channels using the signal compressing apparatus and for multiplexing and transmitting the signals, the first compression mode requiring the processing time for signal compression and the second compression mode of a shorter signal compression time than in the first compression mode are switched for selection in accordance with the contents of signals. Therefore, signals can be transmitted in the compression mode appropriate for the signals to be transmitted.

Although the present invention has been described hereinabove with reference to the preferred embodiments, it is to be understood that the invention is not limited to such illustrative embodiments alone, and various modifications may be contrived without departing from the spirit or essential characteristics thereof, which are to be determined solely from the appended claims.

What is claimed is:

1. A signal compressing apparatus for use with at least two input signals having different contents including a voice signal and a music signal, the apparatus comprising:

first signal compressing means for compressing an input signal fed thereto by performing a first compressing method within a first predetermined time period;

second signal compressing means for compressing said input signal fed thereto by performing a second compressing method within a second predetermined time period longer than said first time period;

selecting means receiving said input signal for discriminating said input signal to determine whether said input signal is a voice signal or a music signal and selecting said first signal compressing means in response to determining said input signal is a voice signal and selecting said second signal compressing means in response to determining said input signal is a music signal, wherein said input signal comprises a balanced input signal and further comprising buffer means for converting said balanced signal to an unbalanced signal; and an analog to digital converter for converting said unbalanced signal into a digital signal fed to said first and second compressing means.

2. The signal compressing apparatus according to claim 1, wherein when the content of said input signal is a music program, said selecting means selects said first signal compressing means; and when the content of said input signal is an announcement said selecting means selects said second signal compressing means.

3. The signal compressing apparatus according to claim 1, wherein said first signal compressing means performs said first signal compressing method by encoding said digital signal and adaptively controlling bit allocation for frequency bands along a frequency axis according to human hearing characteristics.

4. The signal compressing apparatus according to claim 3, wherein said second signal compressing means performs said second signal compressing method by encoding said digital signal according to adaptive differential pulse code modulation.

5. The signal compressing apparatus according to claim 3, wherein said first signal processing means performs said first signal compressing method on said digital signal by encoding according to an adaptive transform acoustic coding method.

6. The signal compressing apparatus according to claim 3, wherein said first signal processing means performs said first signal compressing method by encoding said digital signal by encoding according to a precision adaptive sub-band coding method.

7. The signal compressing apparatus according to claim 1, wherein said selecting means includes switch means connected to outputs of said first and second signal compressing means, and a controller receiving said input signal and determining the content thereof for controlling said switch means to select one of the outputs in accordance with determined content.

8. A signal transmitting apparatus for compressing and transmitting a plurality of input signal channels including a voice signal channel and a music signal channel, comprising:

signal compressing means receiving and selectively compressing said plurality of input signal channels according to one of a first signal compressing mode or a second signal compressing mode in which a compression time in said first mode is longer than a compression time in said second mode;

control means for controlling said signal compressing means to operate in said first mode or said second mode in accordance with whether an input signal channel is a voice signal channel or a music signal channel, so that said first signal compressing mode is selected when said input signal channel is a voice signal channel and said second signal compressing mode is selected when said input signal channel is a music signal channel;

multiplexer means receiving said plurality of signal channels output from said signal compressing means for multiplexing said outputs into a single multiplexed channel;

modulating means for modulating said multiplexed channel with an RF carrier to form an RF output signal for transmission, wherein said plurality of input signal channels comprise respective balanced input signals and further comprising a plurality of buffer means for converting said balanced signals to unbalanced signals; and a plurality of analog to digital converters for converting pairs of said unbalanced signals into digital signals fed to said signal compressing means.

9. The signal transmitting apparatus according to claim 8, wherein when the content of said input signal channels is a music program said control means controls said signal compressing means to operate in said first mode and when the content of said input signal channels is an announcement said control means controls said signal compressing means to operate in said second mode.

10. Apparatus for providing compressed audio signals including a voice signal and a music signal to aircraft passengers listening to the signs over headphones, the apparatus comprising:

signal compressing means receiving and selectively compressing an input audio signal according to one of a first signal compressing mode or a second signal compressing mode, in which a compression time in said first mode is longer than a compression time in said second mode;

control means receiving the input audio signal for controlling said signal compressing means to operate in said first mode or said second mode in accordance with the input audio signal is a voice signal or a music signal, so that said first mode a selected when the audio input signal is a music signal and said second mode is selected when the audio input signal is a voice signal;

audio signal transmitting means for transmitting the selectively compressed signals;

audio signal receiving means for receiving transmitted compressed signals;

signal expanding means for selectively expanding compressed signal received from said audio signal receiving means according to one of a firs signal expanding mode or a second signal expanding mode, in which an expanding time of said first mode is longer than an expanding time of said second mode;

microprocessor means for controlling said signal expanding means to operate in said first expanding mode or said second expanding mode in accordance with the received audio signal is a voice signal or a music signal, so that said first expanding mode is selected when the received audio signal is a music signal and said second expanding mode is selected when the audio input signal is a voice signal, wherein said input audio signal comprises a balanced signal and further comprising a buffer means for converting said balanced signal to an unbalanced signal; and an analog to digital converter for converting said unbalanced signal into a digital signal fed to said signal compressing means.

* * * * *